(12) United States Patent
Bullock

(10) Patent No.: US 7,902,849 B2
(45) Date of Patent: Mar. 8, 2011

(54) APPARATUS AND METHOD FOR TEST STRUCTURE INSPECTION

(75) Inventor: Eugene T. Bullock, Fremont, CA (US)

(73) Assignee: Applied Materials Israel, Ltd., Rehovot (IE)

( * ) Notice: Subject to any disclaimer, the term of this patent is extended or adjusted under 35 U.S.C. 154(b) by 308 days.

(21) Appl. No.: 11/619,496

(22) Filed: Jan. 3, 2007

(65) Prior Publication Data

US 2007/0267632 A1 Nov. 22, 2007

Related U.S. Application Data

(60) Provisional application No. 60/755,942, filed on Jan. 3, 2006.

(51) Int. Cl.
*G01R 31/305* (2006.01)
(52) U.S. Cl. ............... 324/754.22; 324/754.21
(58) Field of Classification Search .......... 324/754–765, 324/751
See application file for complete search history.

(56) References Cited

U.S. PATENT DOCUMENTS

| | | | | |
|---|---|---|---|---|
| 3,974,443 A * | 8/1976 | Thomas | ......... | 324/716 |
| 4,918,377 A * | 4/1990 | Buehler et al. | ......... | 324/691 |
| 5,150,043 A * | 9/1992 | Flesner | ......... | 324/752 |
| 5,821,765 A * | 10/1998 | Ling et al. | ......... | 324/765 |
| 6,091,249 A | 7/2000 | Talbot et al. | | |
| 6,208,151 B1 * | 3/2001 | Aton et al. | ......... | 324/691 |
| 6,362,634 B1 * | 3/2002 | Jarvis et al. | ......... | 324/719 |
| 6,369,591 B1 * | 4/2002 | Cugini et al. | ......... | 324/752 |
| 6,380,554 B1 * | 4/2002 | Bush et al. | ......... | 257/48 |
| 6,747,445 B2 * | 6/2004 | Fetterman et al. | ......... | 324/71.1 |
| 6,842,028 B2 * | 1/2005 | Song et al. | ......... | 324/763 |
| 6,859,052 B1 * | 2/2005 | Vaucher | ......... | 324/751 |
| 7,196,536 B2 * | 3/2007 | Nystrom et al. | ......... | 324/765 |
| 7,486,097 B2 * | 2/2009 | Liegl | ......... | 324/765 |
| 2004/0212389 A1 * | 10/2004 | Hamren et al. | ......... | 324/765 |
| 2005/0122123 A1 * | 6/2005 | Stine et al. | ......... | 324/719 |

FOREIGN PATENT DOCUMENTS

WO  2004/053944 A  6/2004

OTHER PUBLICATIONS

Applied Materials Israel, Ltd., PCT/US2007/060050, International Search Report and Written Opinion, Jul. 3, 2007, 10pp, ISA/EP, European Patent Office.

* cited by examiner

*Primary Examiner* — Ha Tran T Nguyen
*Assistant Examiner* — Richard Isla Rodas
(74) *Attorney, Agent, or Firm* — SNR Denton US LLP

(57) ABSTRACT

Herein are described layouts of test structures and scanning methodologies that allow large probe currents to be used so as to allow the detection of resistive defects with a resistance lower than 1 MΩ while at the same time allowing a sufficient degree of localization to be obtained for root cause failure analysis. The detection of resistances lower than 1 MΩ nominally requires a probe current greater than 1 micro ampere for detection on an electron beam inspection system.

10 Claims, 6 Drawing Sheets

US 7,902,849 B2

APPARATUS AND METHOD FOR TEST STRUCTURE INSPECTION

RELATED APPLICATIONS

This application claims the benefit of U.S. Provisional Application No. 60/755,942, filed Jan. 3, 2006, which is incorporated herein by reference.

FIELD OF THE INVENTION

This invention relates to apparatus and methods for inspecting and testing semiconductor wafers during circuit fabrication.

BACKGROUND OF THE INVENTION

Test structures are often utilized in the semiconductor device industry as a method for rapidly developing a process flow. Many existing methodologies currently exist such as KLA Tencor's uLoop™, Applied Material's, Inc. ADL™ and the RealVision™ jointly developed by Applied Materials Inc. and PDF Solutions Inc. These techniques allow a large number of devices to be rapidly tested allowing determination of root cause failure analysis in a relatively short period of time.

There are two basic requirements of any such technique to be useful for rapid diagnostics and root cause failure analysis. These are 1) detection of the electrical error and 2) localization of the electrical error for failure analysis. For example, electrical test by probe techniques can rapidly measure a very large number of devices. However, when an electrical error is detected it is only localized to a somewhat large area on the test chip. This means that a failure technique such as focused ion beam cross sectioning can only be applied if the defect is further localized by a following technique such as ADL™.

Common to most techniques such as those mentioned above is a relation between the sensitivity to resistance failures, and the amount of current that can be driven into the device. This is in general true because the voltage that can be generated across a resistive error is determined by the current as dictated by Ohm's law. This is particularly important for electron microscopy techniques where the current density determines the amount of current that can be injected into a small feature. The total current in the illuminating beam can be made arbitrarily large, but only by allowing the spot size to also become large.

The invention herein is specifically directed towards electron microscopy techniques and as such the following background material, which pertains specifically to electron microscopy, is presented. As the device scale shrinks to 45 nm technology and beyond, the amount of current that can be injected into an individual device feature becomes limited. For example, using conventional retarding field electron optics, it is possible to provide 200 nanoamperes into a Gaussian shaped probe with a FWHM of 100 nm. A typical feature such as a contact will have a nominal dimension of 1.5 times the device node so that a contact of the 45 nm nose would have a diameter of approximately 70 nm. In this case, only about 30% of the primary beam current or 60 nA would strike the contact. The other 70% would only contribute to the noise of the measurement.

When testing electrically contiguous structures of large spatial extent, the capacitance of the structure will grow proportionally with the area subtended. The total dose required to saturate the capacitance and reach the resistive regime of the electrical response of the structure is therefore also proportional to the area subtended by the structure. The total dose is the product of the current injected by the probe and the time that the probe impinges upon the structure. Typically, as in the case of via chain and metal comb test structures, the defect of interest is a faulty contact or metal short respectively. In both cases, these are resistive defects and the capacitance of the structure is not of interest. In these cases, if the exposure time is short relative to the RC response of the structure with capacitance C containing a defect with capacitance R, the sensitivity will be compromised. To maximize sensitivity, it is necessary to expose the structure under test for a sufficient amount of time to saturate the capacitance of the structure. Accordingly, improved test structures are desirable.

SUMMARY

Herein are described layouts of test structures and scanning methodologies that allow large probe currents to be used so as to allow the detection of resistive defects with a resistance lower than 1 MΩ while at the same time allowing a sufficient degree of localization to be obtained for root cause failure analysis. The detection of resistances lower than 1 MΩ nominally requires a probe current greater than 1 micro ampere for detection on an electron beam inspection system.

BRIEF DESCRIPTION OF THE DRAWINGS

In order to understand the invention and to see how it may be carried out in practice, several preferred embodiments will now be described, by way of non-limiting examples only, with reference to the accompanying drawings, in which.

DETAILED DESCRIPTION

Reference will now be made in detail to an implementation consistent with the present invention as illustrated in the accompanying drawings. Wherever possible, the same reference numbers will be used throughout the drawings and the following description to refer to the same or like parts. Although discussed with reference to these illustrations, the present invention is not limited to the implementations illustrated therein. Hence, the reader should regard these illustrations merely as examples of embodiments of the present invention, the full scope of which is measured only in terms of the claims following this description.

Figure 1:
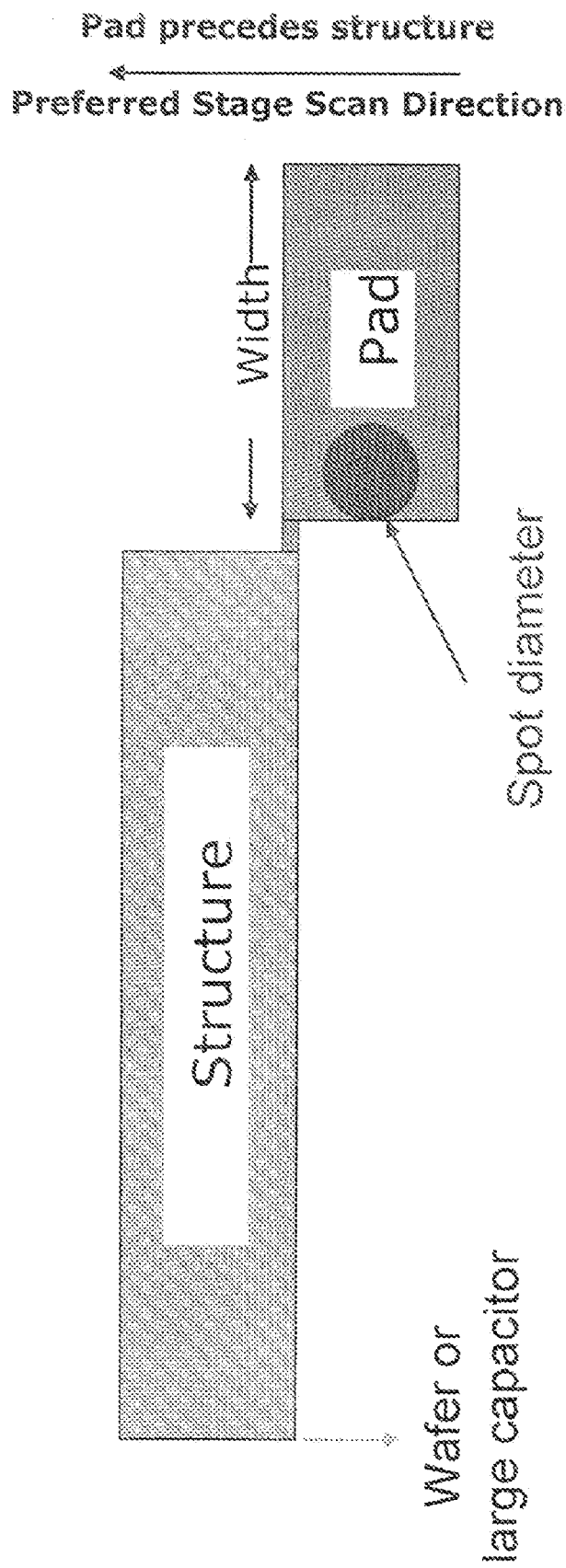
FIG. 1 illustrates a system, according to an embodiment of the invention, wherein a pad is used to allow high current to be injected into the device and said pad integrated into an individual structure.

In one embodiment of the invention, a conducting pad is electrically connected to the structure under test as shown in FIG. 1. In one instance, the pad end of the structure is floating and the opposite end is electrically connected to the wafer. In another instance, both ends are floating and the end opposite the pad is connected to a large capacitance. The dimension of the pad is chosen to allow the entirety of the primary probe current of the inspection system to enter the structure. Since the pad can have a larger contiguous area than that of the devices under test, very large primary beam currents may be used while still allowing the entirety of the current to enter the device, e.g. 1 uA. Furthermore, the size and shape is also chosen to allow a sufficient total dose to enter the structure to saturate its capacitance to the underlying wafer. The dose is the product of the time the probe spends on the pad and the primary probe current. The structure under test could be, as a specific non-limiting example, a contact or via chain system.

Figure 2:
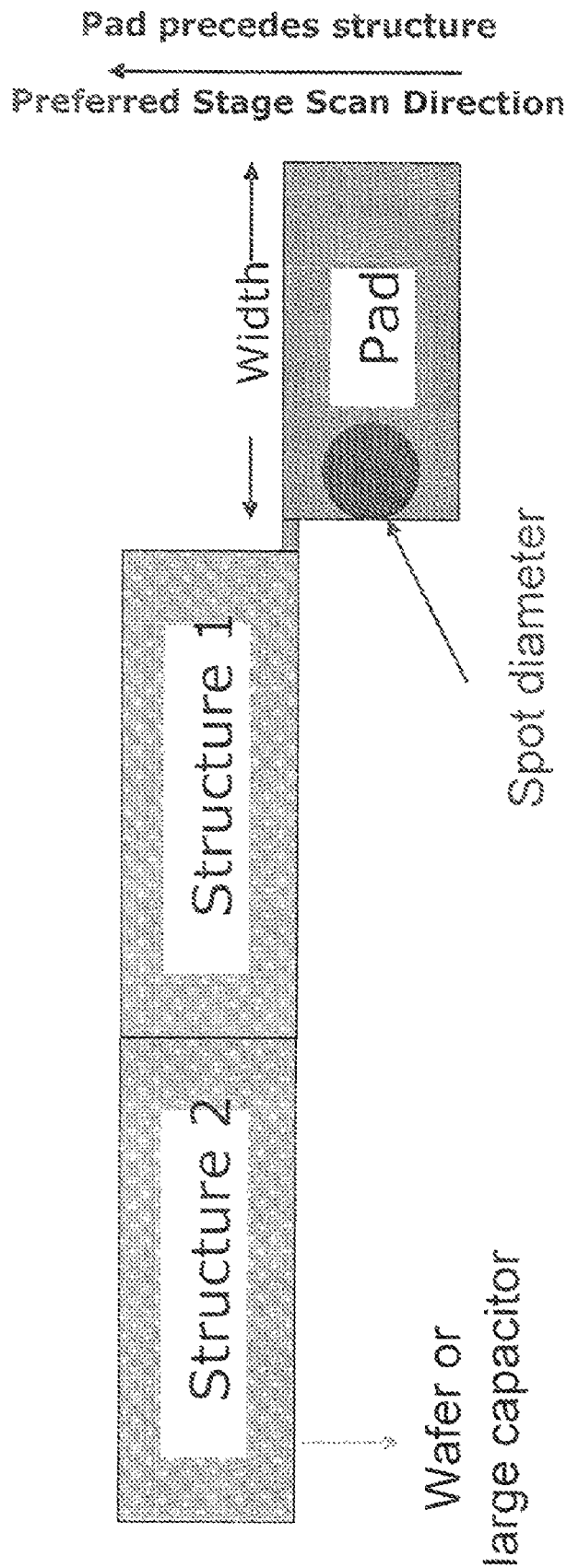
FIG. 2 illustrates a system, according to an embodiment of the invention, wherein a pad is used to allow high current to be injected into the device and said pad is integrated into a structure with a specific geometrical relationship to a second structure.

As illustrated in FIG. 2, in another embodiment of the invention a conducting pad is placed in series with a structure that has a geometrical relationship to a second structure in a way that allows the testing of a desired process step. The pad geometry is chosen based on the same criteria as in the previously described embodiment. Here, the structure to which the pad is connected is electrically isolated, and the second structure is electrically connected to the underlying wafer or to a large capacitance. The structures could be, as a specific non-limiting example, a comb structure for testing shorts between adjacent metal lines.

In the two particular embodiments described above in connection with FIGS. 1 and 2, an electrical defect is localized to the structure or structures associated with a specific pad. A preferred layout is for the structure to have a short height and large width. This allows the defect to be localized quite tightly in one dimension while still allowing a large number of devices to be tested. A second technique such as that used in ADL™ implemented either on the inspection system or later on a dedicated review system can be used to complete the localization of the defect.

Figure 3:
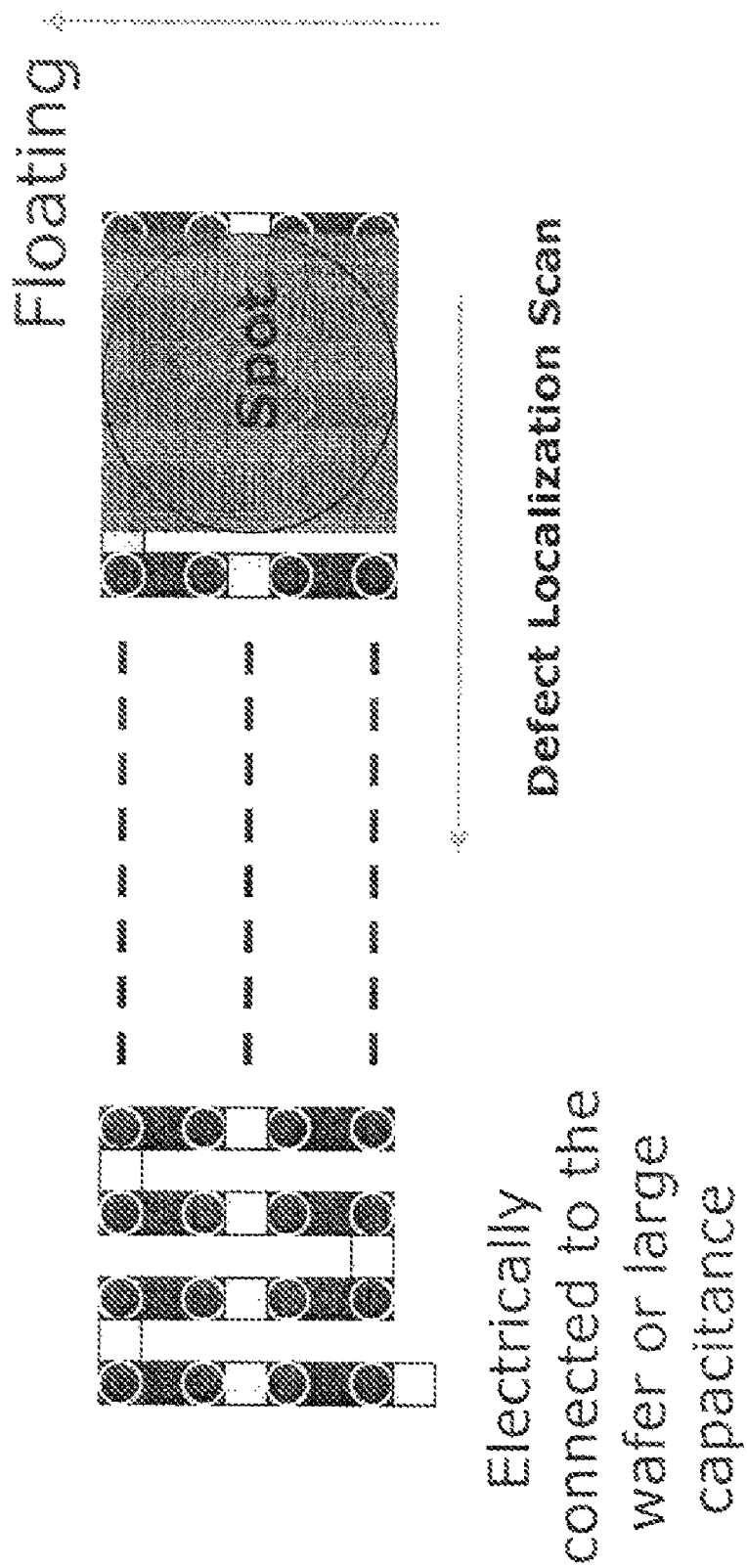
FIG. 3 illustrates a system, according to an embodiment of the invention, wherein a double serpentine structure is used to allow high current to be injected into the device during both a detection and localization step.

As illustrated in FIG. 3, in another embodiment of the invention a double serpentine pattern is used. In this case, a very large spot size can be used while still allowing a large portion of the current to enter the device under test. The specific amount of current entering the device will be proportional to the density of the pattern of the structure. The structure under test could be, as a specific non-limiting example, a contact or via chain system. This structure allows for both the detection and a localization steps to be carried out with high current.

Figure 4:
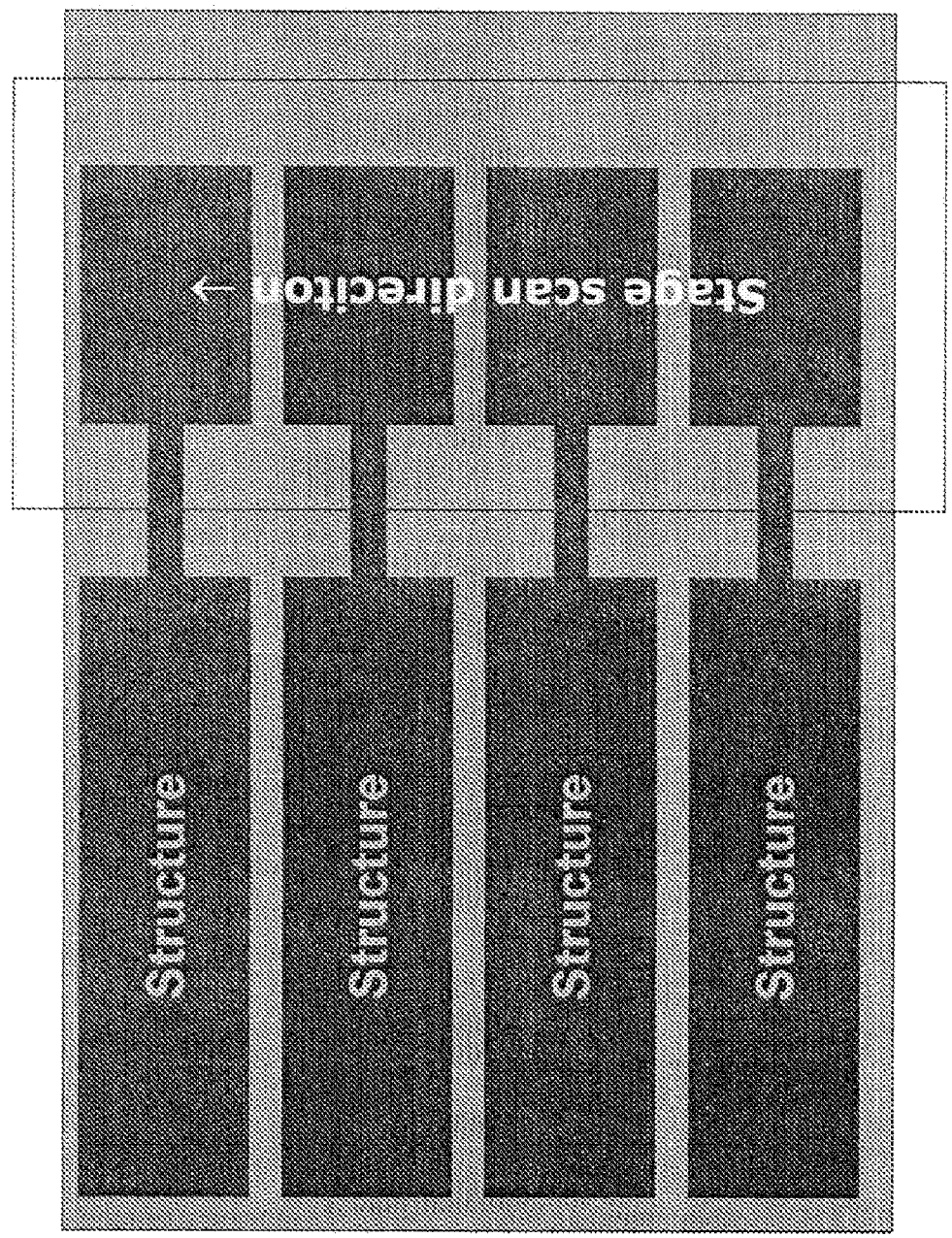
FIG. 4 illustrates a system, according to an embodiment of the invention, wherein structures are laid out sequentially in the stage scan direction.

In a further embodiment of the invention suitable for electron beam inspection systems with a moving stage, structures such as those in the above embodiments are arranged sequentially in the direction of the stage axis, as illustrated in FIG. 4. This allows the pads or structures to be moved under the beam in rapid precession. Additionally, the primary beam can be scanned in the direction perpendicular to the stage motion.

Figure 5:
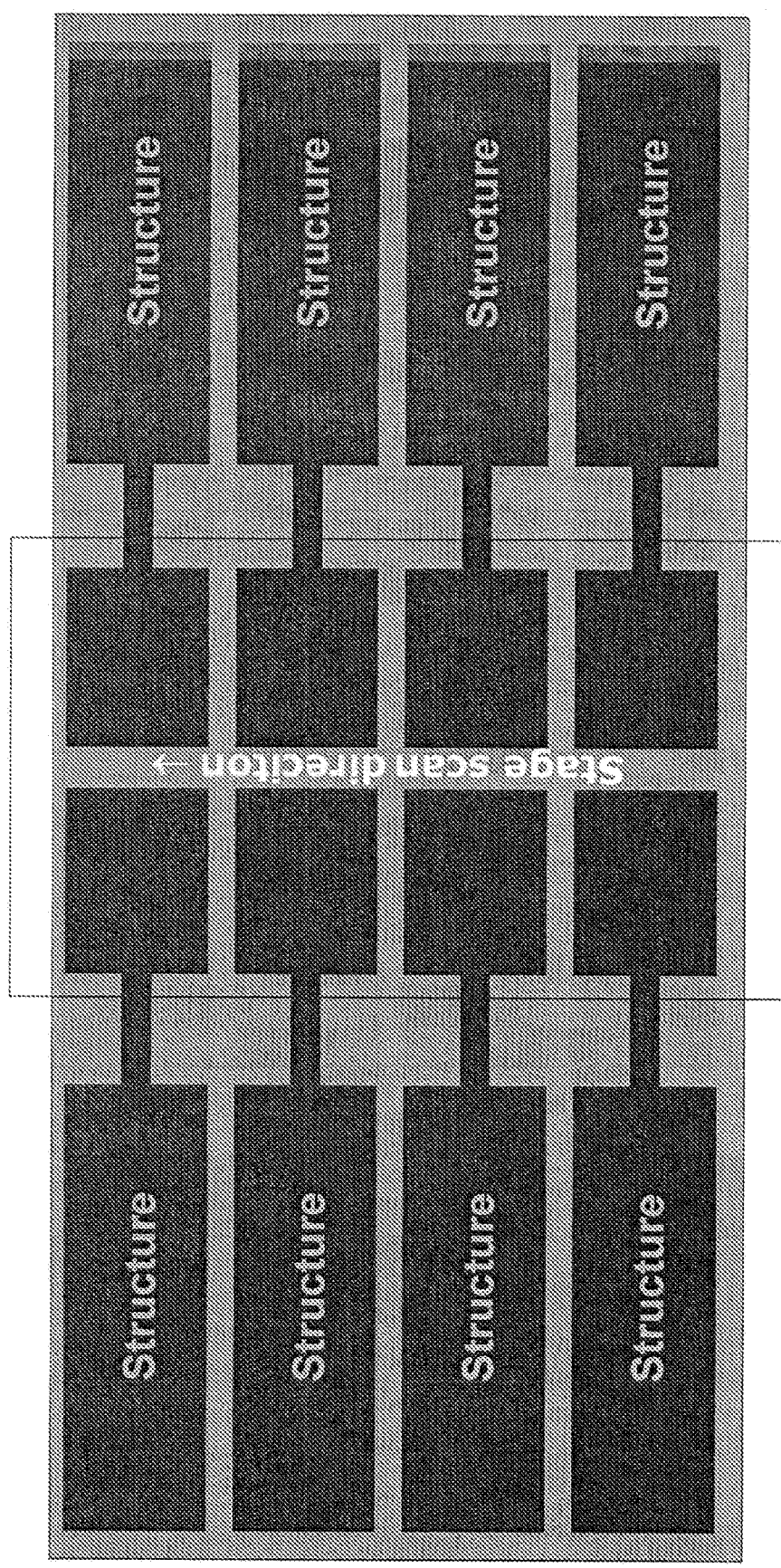
FIG. 5 illustrates a system, according to an embodiment of the invention, wherein structures are laid out both sequentially and mirrored.

In a further embodiment of the invention suitable for electron beam inspection systems with a moving stage, in addition to arranging the structures such as those in the above embodiments sequentially in the direction of the stage axis, they are also arranged in a mirror format (e.g., in opposing pairs) as illustrated in FIG. 5. By both moving the stage and scanning the beam perpendicular to the stage direction, two sets of structures can be tested with one stage motion. The structures on the left and right do not have to be the same.

Figure 6:
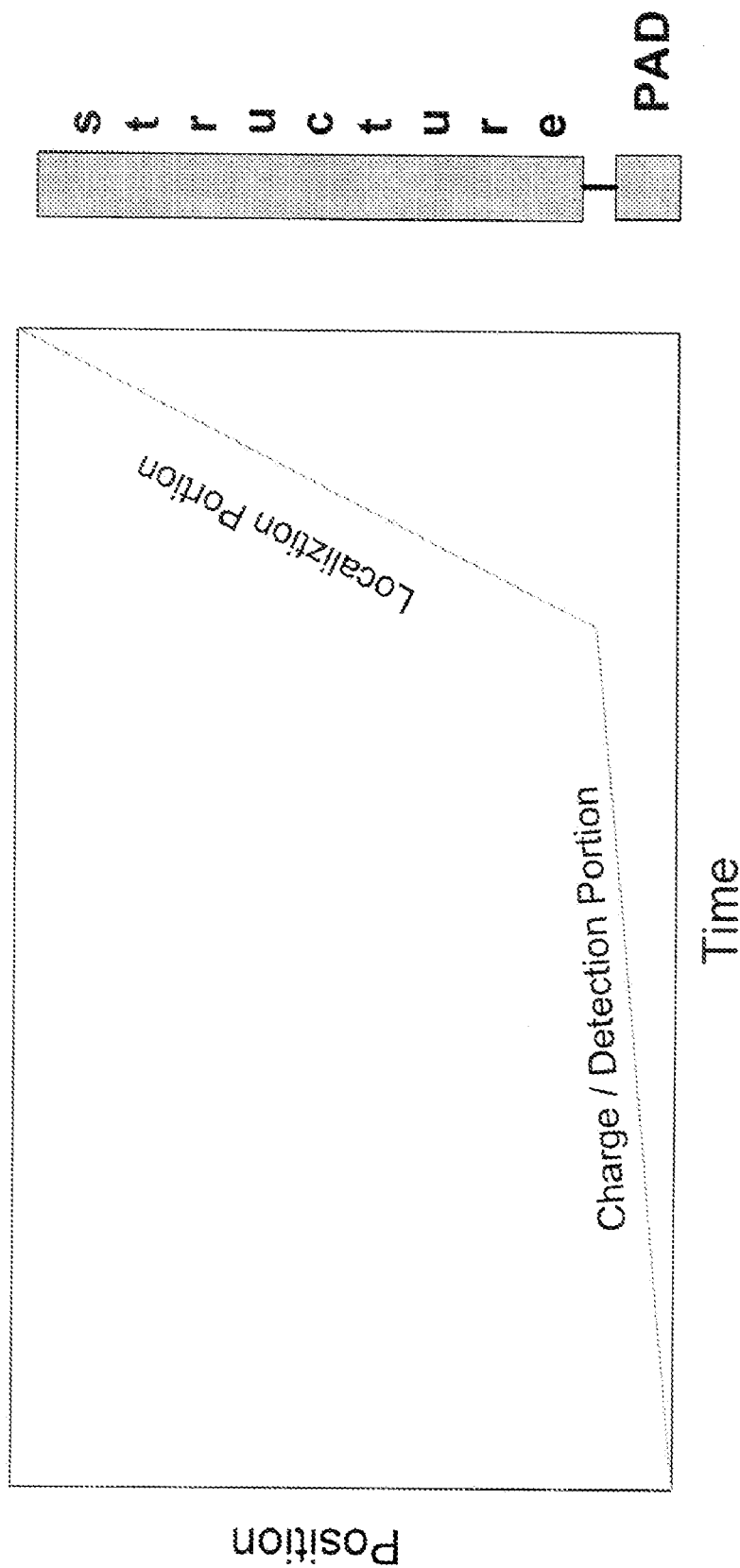
FIG. 6 illustrates a system, according to an embodiment of the invention, providing an example of a non-linear scan used to both detect and localize a defect within a test structure with a pad integrated to allow high current to be injected into the device.

In a further embodiment of the invention, a non-linear scan line is used by the electron beam inspection system to both detect and localize a defect in one step as illustrated in FIG. 6. For a portion of the scan line where the beam directed over a pad region the beam is scanned slowly to allow the injection of a high dose so as to sufficiently charge the structure to allow the defect to be detected. For a second portion of the scan line in which the beam is scanned over the structure under test the beam is scanned quickly. For this embodiment, the width of the structure must be limited to the scan field of the electron microscope.

In another embodiment of the invention, a dedicated extremely high current microscope (>1 uA) with detection capabilities is added to an electron beam inspection system. This allows the electron microscope of the inspection system to be optimized for currents associated with other applications. One non-limiting example of how this might be implemented is as follows. In a first step, the structures are scanned under the high current microscope using the stage. No advanced scanning capability is required for the high current microscope so the microscope can be small and inexpensive. The detected signal during this step is monitored to detect the presence of an electrical error. When an electrical error is sensed, the position of the structure under test is stored. In a following step, the stage is used to bring this structure under the scan field of the electron microscope of the inspection system. In a final step, this electron microscope is used to localize the electrical error.

The foregoing description of various implementations of the invention has been presented for purposes of illustration and description. It is not exhaustive and does not limit the invention to the precise form or forms disclosed. The scope of the invention is defined by the claims and their equivalents.

I claim:

1. A method, comprising:
scanning a plurality of test structures on a wafer using a high current microscope of an electron beam inspection system, the high current microscope having a probe beam current greater than 1 µA, each of the plurality of test structures having a pad end and an end opposite the pad end, the first test structure being longer in one dimension than in a second dimension, and further having a conducting pad electrically connected to the structure at the pad end thereof, the conducting pad having a larger contiguous area than that of the first test structure and being sized sufficiently to allow the entire current of the probe beam to enter the first test structure and saturate a capacitance of the first test structure to the wafer;
monitoring detected signals from the wafer during the scanning to detect electrical errors present in a first test structure of the plurality of test structures;
upon detecting an electrical error, storing a position of the first test structure;
operating a stage to bring the first test structure under a scan field of a second electron microscope of the electron beam inspection system; and
localizing the electrical error using the second electron microscope.

2. The method of claim 1 wherein the pad end of the first test structure is electrically floating, and the end opposite the pad end of the first test structure is electrically coupled to the wafer.

3. The method of claim 1, wherein the pad end and the end opposite the pad end of the first test structure are electrically floating, and the end opposite the pad end of the first test structure is electrically coupled to a capacitor.

4. The method of claim 1, wherein the first test structure is a contact or via chain system.

5. The method of claim 1, wherein the first test structure is formed in a double serpentine pattern.

6. The method of claim 1 wherein the first test structure is positioned in relation to a second test structure so as to allow testing of both the first and second test structures.

7. The method of claim 6, wherein the first and second test structures form a comb structure for testing shorts between adjacent metal lines.

8. The method of claim 1, wherein the first test structure is arranged sequentially along a direction of an axis of the stage so as to enable sequential scanning of the test structures.

9. The method of claim 1, wherein the first test structure is arranged sequentially in a mirror format along a direction of an axis of the stage so as to enable sequential scanning of the test structures.

10. The method of claim 1, wherein the electrical error comprises a resistive defect within a portion of the first test structure.

* * * * *